(12) United States Patent
Catana Salazar et al.

(10) Patent No.: US 11,967,037 B2
(45) Date of Patent: Apr. 23, 2024

(54) OBJECT DEFORMATION DETERMINATION

(71) Applicant: Hewlett-Packard Development Company, L.P., Spring, TX (US)

(72) Inventors: Juan Carlos Catana Salazar, San Diego, CA (US); Jun Zeng, Palo Alto, CA (US); He Luan, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 25 days.

(21) Appl. No.: 17/792,652

(22) PCT Filed: Jan. 17, 2020

(86) PCT No.: PCT/US2020/014053
§ 371 (c)(1),
(2) Date: Jul. 13, 2022

(87) PCT Pub. No.: WO2021/145888
PCT Pub. Date: Jul. 22, 2021

(65) Prior Publication Data
US 2023/0029302 A1 Jan. 26, 2023

(51) Int. Cl.
*G06T 19/20* (2011.01)
*B33Y 50/00* (2015.01)
*G06F 30/27* (2020.01)

(52) U.S. Cl.
CPC .............. *G06T 19/20* (2013.01); *B33Y 50/00* (2014.12); *G06F 30/27* (2020.01); *G06T 2219/2004* (2013.01); *G06T 2219/2021* (2013.01)

(58) Field of Classification Search
CPC ............. G06T 19/20; G06T 2219/2004; G06T 2219/2021; G06T 19/00; B33Y 50/00; G06F 30/02
See application file for complete search history.

(56) References Cited

U.S. PATENT DOCUMENTS

| | | | |
|---|---|---|---|
| 9,454,791 B2 | 9/2016 | Avila et al. | |
| 9,715,761 B2 | 7/2017 | Lee et al. | |
| 10,144,063 B2 | 12/2018 | Ljungblad | |
| 10,265,911 B1 | 4/2019 | Capri et al. | |
| 10,452,949 B2* | 10/2019 | Jia | G06T 7/30 |
| 10,525,629 B2 | 1/2020 | Zhang et al. | |
| 2008/0317383 A1* | 12/2008 | Franz | G06V 10/757 382/294 |
| 2014/0029857 A1* | 1/2014 | Kompalli | G06V 10/757 382/212 |
| 2016/0240001 A1* | 8/2016 | Sheffer | G06T 17/20 |
| 2017/0292922 A1 | 10/2017 | Woods et al. | |
| 2017/0368753 A1* | 12/2017 | Yang | G01B 21/20 |
| 2018/0093419 A1* | 4/2018 | Lappas | G06T 19/00 |
| 2018/0275637 A1* | 9/2018 | Elber | G06T 19/20 |
| 2018/0322621 A1 | 11/2018 | Craeghs et al. | |

(Continued)

*Primary Examiner* — Michael Le
(74) *Attorney, Agent, or Firm* — Shook, Hardy & Bacon L.L.P.

(57) ABSTRACT

Examples of methods for object deformation determination are described herein. In some examples, a method includes aligning a first bounding box of a three-dimensional (3D) object model with a second bounding box of a scan. In some examples, the method includes determining a deformation between the 3D object model and the scan based on the alignment.

7 Claims, 5 Drawing Sheets

100

| Align a first bounding box of a 3D object model with a second bounding box of a scan | 102 |

| Determine a deformation between the 3D object model and the scan based on the alignment | 104 |

(56) References Cited

U.S. PATENT DOCUMENTS

| | | | | |
|---|---|---|---|---|
| 2019/0050506 A1* | 2/2019 | Umetani | ............... | G06T 19/20 |
| 2019/0337231 A1* | 11/2019 | Fan | ..................... | G06F 30/00 |
| 2022/0229943 A1* | 7/2022 | Uy | ........................ | G06N 3/08 |

* cited by examiner

OBJECT DEFORMATION DETERMINATION

BACKGROUND

Three-dimensional (3D) solid parts may be produced from a digital model using 3D manufacturing. 3D manufacturing may be used in rapid prototyping, mold generation, mold master generation, and short-run manufacturing. Examples of 3D manufacturing include 3D printing. In some 3D manufacturing techniques, build material may be cured or fused.

DETAILED DESCRIPTION

Figure 1:
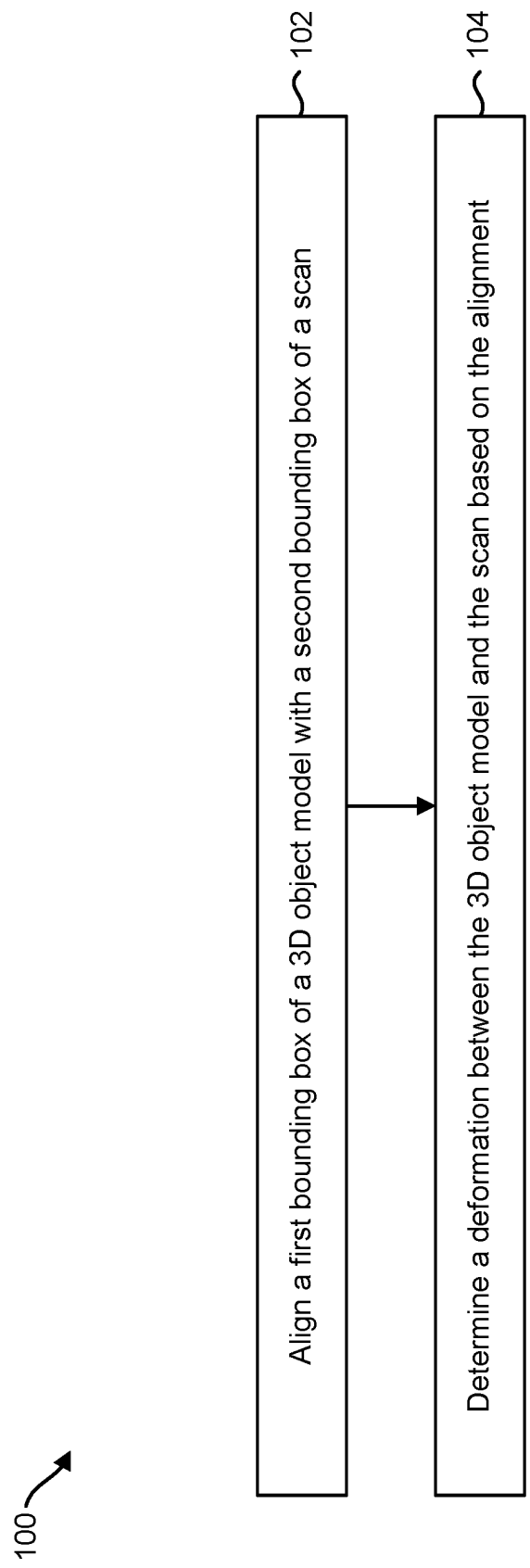
FIG. 1 is a flow diagram illustrating an example of a method for determining object deformation.

Three-dimensional (3D) manufacturing may be used to manufacture 3D objects. 3D printing is an example of 3D manufacturing. In some examples of 3D printing, thermal energy may be projected over material in a build area, where a phase change and solidification in the material may occur at certain voxels. A voxel is a representation of a location in a 3D space (e.g., a component of a 3D space). For instance, a voxel may represent a volume that is a subset of the 3D space. In some examples, voxels may be arranged on a 3D grid. For instance, a voxel may be cuboid or rectangular prismatic in shape. In some examples, voxels in the 3D space may be uniformly sized or non-uniformly sized. Examples of a voxel size dimension may include 25.4 millimeters (mm)/150≈170 microns for 150 dots per inch (dpi), 490 microns for 50 dpi, 2 mm, 4 mm, etc.

In some examples, the techniques described herein may be utilized for various examples of 3D manufacturing. For instance, some examples may be utilized for plastics, polymers, semi-crystalline materials, metals, etc. Some additive manufacturing techniques may be powder-based and driven by powder fusion. Some examples of the approaches described herein may be applied to area-based powder bed fusion-based additive manufacturing, such as Stereolithography (SLA), Multi-Jet Fusion (MJF), Metal Jet Fusion, metal binding printing, Selective Laser Melting (SLM), Selective Laser Sintering (SLS), liquid resin-based printing, etc. Some examples of the approaches described herein may be applied to additive manufacturing where agents carried by droplets are utilized for voxel-level thermal modulation.

In some examples of additive manufacturing, thermal energy may be utilized to fuse material (e.g., particles, powder, etc.) to form an object. For example, agents (e.g., fusing agent, detailing agent, etc.) may be selectively deposited to control voxel-level energy deposition, which may trigger a phase change and/or solidification for selected voxels. The manufactured object geometry may be driven by the fusion process, which enables predicting or inferring the geometry following manufacturing. Predicting or inferring the geometry may indicate predicted or inferred object deformation. Object deformation is a change or disparity in object geometry from a target geometry (e.g., 3D object model geometry). Object deformation may occur during manufacturing due to thermal diffusion, thermal change, gravity, manufacturing errors, etc. For example, uneven heating and/or cooling of temperatures of the material in manufacturing may produce objects with geometrical deformations. Geometrical deformations may be manifested by shrinkages (e.g., negative deformation) and/or expansions (e.g., positive deformation) over the object surface. In some examples, a deformation of an object may be computed by aligning a 3D object model and a scan (e.g., scanned model) with high (e.g., maximum) overlap and calculating a distance between both surfaces.

A 3D object model is a 3D geometrical model of an object. Examples of 3D object models include computer-aided design (CAD) models, mesh models, 3D surfaces, etc. In some examples, a 3D object model may refer to exterior polygons of an object (without interior polygons, for instance). For instance, a 3D object model may be expressed as a mesh of a surface (e.g., exterior polygons) of a 3D object. In some examples, a 3D object model may be utilized to manufacture (e.g., print) an object.

A variety of techniques for quantitative modeling may be utilized to predict or infer the geometry and/or deformation of a 3D object. Some techniques may be based on a thermal simulation that includes calculating object deformation that may occur in layer-by-layer manufacturing. Some techniques may be based on a machine learning approach (e.g., deep learning approach).

A machine learning model is a structure that learns based on training. Examples of machine learning models may include artificial neural networks (e.g., deep neural networks, convolutional neural networks (CNNs), dynamic graph CNNs (DGCNNs), etc.). Training the machine learning model may include adjusting a weight or weights of the machine learning model. For example, a neural network may include a set of nodes, layers, and/or connections between nodes. The nodes, layers, and/or connections may have associated weights. The weights may be adjusted to train the neural network to perform a function, such as predicting object geometry after manufacturing or object deformation. Examples of the weights may be in a relatively large range of numbers, and may be negative or positive.

In some examples, a machine learning model (e.g., a deep neural network) may be utilized to predict object geometry of an object after manufacturing and/or to predict object deformation from a 3D object model (e.g., computer-aided design (CAD) model). For example, a machine learning model may provide a quantitative model for directly predicting object deformation. For instance, deep learning may be utilized to predict object deformation. A machine-learning model may be trained with scanned objects that were manufactured (e.g., scanned objects that were printed with a 3D printer).

Quantitative modeling (e.g., first-principle based simulation and/or data-driven deep learning) may utilize quantitative assessment of object deformation as a ground truth. Obtaining a quantitative assessment of object deformation may present challenges in a production environment. For example, a manufacturer (e.g., factory) may produce many builds (e.g., tens of builds weekly), where each build may include hundreds or thousands of objects, and where each object may be unique. It may be difficult or impractical to manually assess deformation of scanned objects (e.g., point clouds) relative to 3D object models (e.g., object CAD files).

Some examples of the techniques described herein may include automated approaches for determining object deformation. Some examples may find corresponding (e.g., compatible) pairs of 3D object models and scans (e.g., CAD-scan pairs) and may find a spatial transformation to align the scan with the 3D object model. Some examples may assess or determine deformation of a manufactured object. For instance, deformation of printed object geometry may be determined. Some examples may determine a statistical deformation metric or metrics (e.g., mean, standard deviation, variance, etc.) that indicates object deformation at an object level, build level, and/or production-line level, etc. Some of the techniques described herein may be utilized to assess one object or many objects (e.g., different objects in a build) for deformation.

In some examples, an assessment of the deformation of a scanned point cloud may be used to determine metrics about manufacturing accuracy (e.g., print accuracy). Examples of metrics about manufacturing accuracy may include mean, median, and/or standard deviation of deformation. Assessing object accuracy in a pool of manufactured objects may enable detecting objects that are outside of a tolerated accuracy and/or may enable evaluating deformation at different placements inside the build volume.

In some examples, point clouds may be utilized to represent 3D objects and/or 3D object geometry. A point cloud is a set of points or locations in a 3D space. A point cloud may be utilized to represent a 3D object or 3D object model. For example, a 3D object may be scanned with a 3D scanner (e.g., depth sensor(s), camera(s), light detection and ranging (LIDAR) sensors, etc.) to produce a point cloud representing the 3D object (e.g., manufactured object, 3D printed object, etc.). The point cloud may include a set of points representing locations on the surface of the 3D object in 3D space. In some examples, a point cloud may be generated from a 3D object model (e.g., CAD model). For example, a random selection of the points from a 3D object model may be performed. For instance, a point cloud may be generated from a uniform random sampling of points from a surface of a 3D object model in some approaches. In some examples, a point cloud may be generated by uniformly projecting points over the surface of 3D object model mesh. For example, a uniform density of points over the whole surface or a constant number of points per triangle in the mesh may be generated in some approaches. A uniform projection may refer to selecting points (e.g., point pairs) within a threshold distance from each other. A point cloud may be an irregular structure, where points may not necessarily correspond to a uniform grid.

In some examples, each point of the model point cloud may be utilized and/or deformation assessment may be performed for all points of the model point cloud. In some examples, a subset of points of the model point cloud may be utilized and/or deformation assessment may be performed for the subset of points of the model point cloud.

Some machine learning approaches may utilize training data to predict or infer manufactured object deformation. The training data may indicate deformation that has occurred during a manufacturing process. For example, object deformation may be assessed based on a 3D object model (e.g., computer aided drafting (CAD) model) and a scan of an object that has been manufactured based on the 3D object model. The object deformation assessment (e.g., the 3D object model and the scan) may be utilized as a ground truth for machine learning. For instance, the object deformation assessment may enable deformation prediction and/or compensation. In order to assess object deformation, the 3D object model and the scan may be registered. Registration is a procedure to align objects.

In some examples, a machine learning model may be trained using point clouds of 3D object models (e.g., computer-aided design (CAD) models) and point clouds from scans of corresponding 3D objects after manufacturing. For instance, a 3D object model or models may be utilized to manufacture (e.g., print) a 3D object or objects. A model point cloud or clouds may be determined from the 3D object model(s). A point cloud or point clouds may be obtained by scanning the manufactured 3D object or objects. In some examples, a ground truth for training the machine learning model may include the point cloud(s) of a scan after alignment to the model point clouds. In some examples, a ground truth for training the machine learning model may include a deformation point cloud or deformation point clouds, which may be calculated as a difference between 3D scanned point cloud(s) and 3D object model(s) point cloud(s). In some examples, a machine learning model may be trained with first point clouds from 3D object models and second point clouds from scanned objects.

In some examples, pairs of models and scans may be analyzed to quantify object deformation. For example, a 3D object model (and/or a point cloud of a 3D object model) may be compared with a corresponding deformed model or scan (e.g., deformation point cloud) to quantify the object deformation. In some examples, the quantification of object deformation may be utilized to train a deep neural network (e.g., to build a quantitative model) that predicts a compensated point cloud from the predicted or inferred geometry for a manufactured object.

Throughout the drawings, identical or similar reference numbers may designate similar, but not necessarily identical, elements. The figures are not necessarily to scale, and the size of some parts may be exaggerated to more clearly illustrate the example shown. Moreover, the drawings provide examples and/or implementations in accordance with the description; however, the description is not limited to the examples and/or implementations provided in the drawings.

FIG. 1 is a flow diagram illustrating an example of a method 100 for determining object deformation. The method 100 and/or an element or elements of the method 100 may be performed by an apparatus (e.g., electronic device). For example, the method 100 may be performed by the apparatus 302 described in connection with FIG. 3.

The apparatus may align 102 a first bounding box of a 3D object model with a second bounding box of a scan. A 3D object model is a 3D geometrical model of an object. Examples of 3D object models include CAD models, mesh models, 3D surfaces, etc. In some examples, a 3D object model may be utilized to manufacture (e.g., print) an object. In some examples, the apparatus may receive a 3D object model from another device (e.g., linked device, networked device, removable storage, etc.) or may generate the 3D object model.

A scan of an object is data corresponding to a physical object in 3D. For example, a scanning device (e.g., camera(s), depth sensor(s), LIDAR, etc.) may be utilized to scan a physical object in 3D. A scan may be expressed as a point cloud, depth map, mesh, etc. In some examples, the apparatus may receive a scan or scans of an object or objects from another device (e.g., linked device, networked device, removable storage, etc.) or may capture the scan.

A bounding box is a geometrical shape that bounds (e.g., includes) an object. For example, a bounding box may be a cuboid, rectangular prism, 3D polygon, etc. One type of bounding box is a minimum bounding box. A minimum bounding box is a smallest volume or smallest size cuboid that encloses an object. A minimum bounding box may or may not be unique and/or may or may not be parallel to an axis in a 3D space. In some examples, the apparatus may determine the first bounding box of the 3D object model. For instance, the apparatus may determine dimensions of the 3D object model (e.g., minimum and maximum X-axis coordinates, minimum and maximum Y-axis coordinates, and minimum and maximum Z-axis coordinates) and may determine a cuboid (e.g., a cuboid with minimum dimensions) that encloses the dimensions of the 3D object model. In some examples, the apparatus may determine the second bounding box of the scan of the object. For instance, the apparatus may determine dimensions of the scan (e.g., minimum and maximum X-axis coordinates, minimum and maximum Y-axis coordinates, and minimum and maximum Z-axis coordinates) and may determine a cuboid (e.g., a cuboid with minimum dimensions) that encloses the dimensions of the scan. In some examples, the apparatus may determine multiple bounding boxes for multiple objects, shapes, and/or scans. For instance, the apparatus may determine dimensions of the objects, shapes, and/or scans (e.g., minimum and maximum X-axis coordinates, minimum and maximum Y-axis coordinates, and minimum and maximum Z-axis coordinates) and may determine cuboids (e.g., cuboids with minimum dimensions) that respectively enclose the dimensions of the objects, shapes, and/or scans.

In some examples, the alignment 102 may be a deterministic alignment. A deterministic alignment is an alignment that is not random. For example, a deterministic alignment may follow a procedure that does not include the use of random point selections, positions, orientations, shifts, rotations, transformations, etc. In some examples, aligning 102 a first bounding box of a 3D object model with a second bounding box of a scan may be performed by determining a set of overlap scores based on a set of orientations between the first bounding box and the second bounding box. An orientation is a directionality or rotational position for a shape or object in 3D space. For example, orientations may be expressed as rotations, quaternions, rotation matrices, vectors, etc. A set of orientations is a plurality of orientations that may be applied to an object (e.g., a scan of an object and/or a 3D object model). In some examples, the orientations may be expressed and/or applied as a set of X, Y, and/or Z rotations to determine a rough alignment or alignments. In some examples, the set of orientations may include orthogonal angle rotations for an axis or axes. For instance, the set of orientations may include rotations of 0 degrees (0°), 90°, 180°, and 270° for the X axis, 0°, 90°, 180°, and 270° for the Y axis, and 90° and 270° for the Z axis. Accordingly, the set of rotations may include 24 rotations in some examples. In some examples, more or fewer rotations may be included in the orientations. For instance, a set of orientations may include 45° rotations for an axis or axes. In some examples, the set of orientations may be limited. For instance, the set of orientations may include less than or equal to 12, 20, 24, 30, 32, 40, 48, 50, 70, or 100 orientations, etc. In some examples, the apparatus may apply the set of orientations to the scan of the object and/or to the 3D object model. For instance, the apparatus may apply the rotations of each orientation to the scan.

An overlap score is a value that indicates an amount of overlap between objects and/or shapes. For example, the apparatus may superimpose (e.g., center) the first bounding box and the second bounding box at an origin of a coordinate system and determine an amount of overlap between the first bounding box and second bounding box and/or between the 3D object model and the scan. In some examples, deterministic alignment and/or random registration may produce an overlap score.

In some examples, the apparatus may determine a set of overlap scores based on the set of orientations. For instance, each overlap score of the set of overlap scores may correspond to an orientation of the set of orientations. In some examples, an overlap score may be determined based on an overlap between the first bounding box and the second bounding box at an orientation. For instance, the apparatus may apply an orientation to the second bounding box and determine the overlap between the first bounding box and the seconding bounding box at that orientation. The orientation may be applied with or without the scan (or the 3D object model) corresponding to the bounding box. In some examples, an overlap score may be determined based on an overlap between the 3D object model and the scan at an orientation. For instance, the apparatus may apply an orientation to the scan and determine the overlap between the 3D object model and the scan at that orientation.

In some examples, determining an overlap score may include calculating an intersection ratio. An intersection ratio is a ratio of an intersection of objects or shapes to a union of the objects or shapes. In some examples, the apparatus may calculate an intersection ratio by calculating a volume of an intersection of bounding boxes (e.g., of the first bounding box and the second bounding box) divided by a volume of a union of the bounding boxes (e.g., of the first bounding box and the second bounding box). In some examples, the apparatus may calculate an intersection ratio by calculating a volume of an intersection of objects (e.g., of the 3D object model and the scan) divided by a volume of a union of the objects (e.g., of the 3D object model and the scan). The intersection ratio may be an example of the overlap score.

In some examples, the apparatus may align 102 the first bounding box with the second bounding box based on the set of overlap scores. For example, the apparatus may align the scan with the 3D object model based on a candidate orientation or candidate orientations indicated by the overlap scores. A candidate orientation is an orientation that satisfies a selection criterion or criteria. For example, aligning 102 the first bounding box (and/or 3D object model) with the second bounding box (and/or scan) may include selecting a candidate orientation or candidate orientations based on the set of overlap scores. In some examples, a selection criterion may be a threshold (e.g., 75%, 80%, 85%, 90%, 95%, 97%, 0.75, 0.8, 0.85, 0.9, 0.95, 0.97, etc.) for the overlap scores. For instance, the apparatus may compare the overlap scores with the threshold to select a candidate orientation or candidate orientations. For example, the apparatus may select a candidate orientation or candidate orientations having a corresponding overlap score (e.g., intersection ratio) of 95% or greater. In some examples, the apparatus may select a candidate orientation with a greatest (e.g., highest, maximum) overlap score of the overlap scores. The selected candidate orientation may be the alignment in some examples.

The apparatus may determine 104 a deformation between the 3D object model and the scan based on the alignment. The deformation may be an indication of a difference, change, disparity, and/or distance between the scanned object and the 3D object model. For example, the apparatus may determine 104 the deformation as a difference or differences and/or distance or distances between the scanned object and the 3D object model. The deformation may be determined based on the alignment. For example, the difference(s) or distance(s) may be determined between the aligned scan and 3D object model. For instance, the apparatus may determine a Euclidean distance between a point of the scan and a point of the 3D object model. In some examples, the apparatus may train a machine learning model using the 3D object model deformation assessment as a ground truth.

In some examples, determining 104 the deformation may include determining whether an overlap score of the alignment meets a verification criterion. A verification criterion is a criterion or criteria to be satisfied for alignment quality. An example of a verification criterion may include an alignment verification threshold. For example, determining 104 the deformation may include comparing the overlap score with an alignment verification threshold. For instance, the apparatus may determine whether an overlap score of the alignment meets an alignment verification threshold. In some examples, the overlap score may meet a verification threshold if the overlap score is greater than or equal to the alignment verification threshold. Examples of the alignment verification threshold may include 75%, 80%, 85%, 90%, 92%, 93%, 95%, etc.

In some examples, determining 104 the deformation may include determining a point-to-point distance between the 3D object model and the scan in a case that the verification criterion is met. For instance, the apparatus may determine a point-to-point distance (e.g., Euclidean) between a point of the 3D object model and a point of the scan. For instance, the apparatus may determine point-to-point distances between pairs of points (e.g., corresponding point pairs) from the 3D object model and the scan.

In some examples, determining 104 the deformation may include determining a deformation metric based on the point-to-point distance(s). A deformation metric is a metric that indicates a quantity or degree of deformation. Examples of a deformation metric may include statistical deformation metrics, which may include a mean, median, standard deviation, and/or variance of the deformation (e.g., point-to-point distances).

In some examples, determining 104 the deformation may include performing a random registration in a case that the verification criterion is not met. A random registration is a registration procedure that includes an aspect of randomness. For example, random registration may include random point selection. Some approaches for random registration may include downsampling point clouds, extracting a feature histogram (e.g., Fast Point Feature Histogram (FPFH)) descriptor of each point, selecting random points in the source cloud, and detecting corresponding points in the target cloud by querying nearest neighbors in the feature space (e.g., FPFH feature space). In some examples, the source cloud may be the point cloud of the scan (or the 3D object model), and the target cloud may be the point cloud of the 3D object model (or the scan). The source cloud may be transformed iteratively to provide a rough alignment of the down-sampled point clouds. In some examples, the transformation of the down-sampled source point cloud may be utilized for a local refinement procedure (e.g., iterative closest point (ICP)) as an initialization to compute a more accurate alignment of the point clouds (e.g., dense point clouds). For example, the apparatus may determine a point cloud or point clouds of the 3D object model and/or scan for a local refinement procedure with a higher density than that of a point cloud or point clouds utilized for an initial (e.g., rough) alignment. In some examples, performing the random registration may produce a second overlap score. For example, an overlap score may be evaluated for each alignment (e.g., location, orientation, transformation, etc.) of the random registration. An alignment with the second overlap score (e.g., a greatest overlap score) may be selected.

In some examples, determining 104 the deformation may include determining whether the second overlap score meets a verification criterion. The verification criterion for the second overlap score may be the same as the verification criterion for the first overlap score, or may be a different verification criterion (e.g., same or different alignment verification threshold). For example, determining 104 the deformation may include comparing the second overlap score with an alignment verification threshold. For instance, the apparatus may determine whether the second overlap score of the alignment (from the random registration, for instance) meets an alignment verification threshold. In some examples, the second overlap score may meet a verification threshold if the second overlap score is greater than or equal to the alignment verification threshold. Examples of the alignment verification threshold (for the second overlap score, for instance) may include 75%, 80%, 85%, 90%, 92%, 93%, 95%, etc. In a case that the second overlap threshold meets the alignment verification threshold, the apparatus may determine the point-to-point distance(s) and/or the deformation metric(s) as described above. For instance, the apparatus may determine the point-to-point distance(s) and/or the deformation metric(s) based on the random registration.

In some examples, the apparatus may provide the determined deformation (e.g., point-to-point distance(s), deformation metric(s), and/or overlap score(s)). For instance, the apparatus may store the determined deformation, may send the determined deformation to another device, and/or may present the determined deformation (on a display and/or in a user interface, for example). For example, the apparatus may present the determined deformation (e.g., point-to-point distance(s), deformation metric(s), and/or overlap scores) on a display. In some examples, the apparatus may plot the deformation metric(s). For instance, the apparatus may plot the deformation metric with a dimensional tolerance. A dimensional tolerance is an amount (e.g., threshold) of tolerated deformation relative to a size of an object (e.g., 3D object model). The dimensional tolerance may be based on a size of an object or 3D object model. In some examples, the size of an object may be indicated based on a dimension or dimensions of an object (e.g., 3D object model). For example, the size of an object may be a function of height, width, and/or depth of a 3D object model. In some examples, a size of an object may be indicated by a diagonal length over a bounding box of the 3D object model and/or over a bounding box of a scan. For instance, a diagonal length may be a maximum length of a line through a bounding box (e.g., from one corner of the bounding box through the center of the bounding box to another corner of the bounding box). In some examples, the apparatus may plot the deformation metric with a dimensional tolerance. For example, the apparatus may plot and/or present the deformation metric (e.g., mean, median, standard deviation, mean+standard deviation, and/or variance, etc.) on a graph with a dimensional tolerance.

Figure 2:
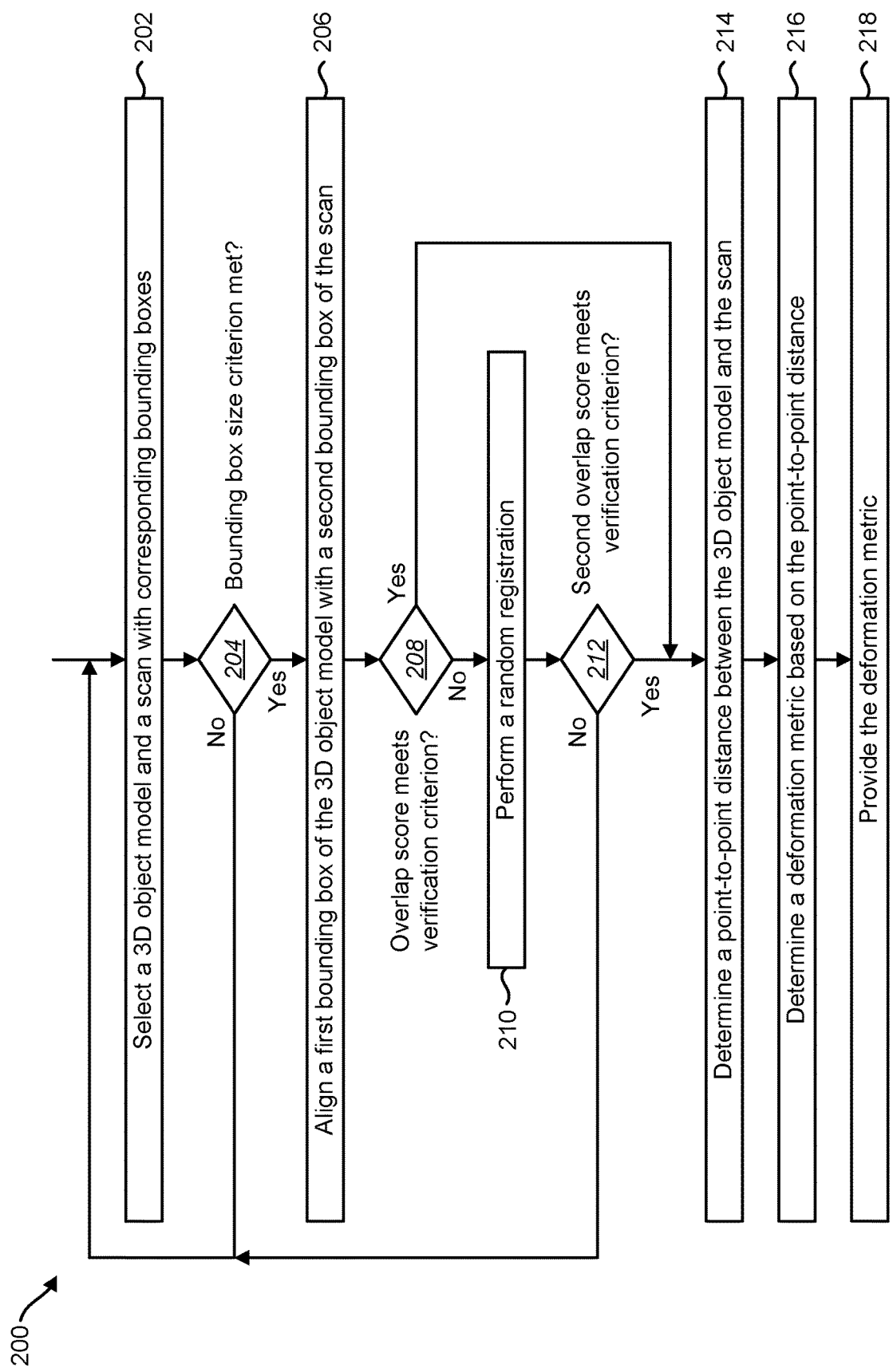
FIG. 2 is a flow diagram illustrating another example of a method for determining object deformation for an object or objects.

FIG. 2 is a flow diagram illustrating another example of a method 200 for determining object deformation for an object or objects. The method 200 and/or an element or elements of the method 200 may be performed by an apparatus (e.g., electronic device). For example, the method 200 may be performed by the apparatus 302 described in connection with FIG. 3.

The apparatus may select 202 a 3D object model and a scan with corresponding bounding boxes. For example, the apparatus may select a 3D object model from a set of 3D object models (e.g., 3D object models from a build, builds, production line, etc.). The 3D object model may have a corresponding first bounding box and/or the apparatus may determine the first bounding box. For example, the apparatus may determine the first bounding box (e.g., minimum bounding box) of the 3D object model as described in relation to FIG. 1. In some examples, the 3D object model may be selected in an order or at random. For example, the 3D object models may be sorted by size and selected in that order.

In some examples, the apparatus may select a scan from a set of scans (e.g., scans from a build, builds, production line, etc.). The scan may have a corresponding second bounding box and/or the apparatus may determine the second bounding box. In some examples, the second bounding box may be a scan bounding box. A scan bounding box is a bounding box of a scan of an object. In some examples, determining a scan bounding box or boxes may be performed as described in relation to FIG. 1. For instance, the apparatus may determine a bounding box (e.g., minimum bounding box) for each of a set of scans. In some examples, the scanned object or objects may be objects that were manufactured (e.g., 3D printed). The manufactured objects may correspond to 3D object models. In some examples, the set of scans may be scans of different types of objects. For instance, the set of scans may include scans of different objects corresponding to different 3D object models. In some examples, the scan may be selected in an order or at random. For example, the scans may be sorted by size and selected in that order.

In some examples, the correspondence between a 3D object model and a scan may be unknown initially. Some examples of the techniques described herein may utilize a bounding box criterion to determine whether a 3D object model corresponds to a scan.

The apparatus may determine 204 whether a bounding box size criterion is met. The bounding box size criterion may enable determining a second bounding box that is likely to enclose a same type of object as the 3D object model. Determining the second bounding box based on a size may be beneficial by determining a bounding box that likely corresponds to a same object type and/or by eliminating a bounding box that likely corresponds to a different object type. Examples of the building box size criterion may include a volume percentage difference threshold and/or a size difference threshold. In a case that the bounding box size criterion is not met, operation may return to selecting 202 a 3D object model and scan with corresponding bounding boxes. For example, if a bounding box of a scan does not meet the bounding box size criterion in relation to the first bounding box of the 3D object model, the apparatus may select another scan and a bounding box of the scan. In some examples, this procedure may repeat until the bounding box size criterion is met or until none of the scans meets the bounding box size criterion. For instance, in an approach where the scans are sorted by size, some of the scans can be ruled out and not evaluated (e.g., if the scan bounding box is too large to meet the criterion, then larger scan bounding boxes may be ruled out, or if the scan bounding box is too small to meet the criterion, then smaller scan bounding boxes may be ruled out). A bounding box that meets the bounding box size criterion may be determined as the second bounding box.

In some examples, the bounding box size criterion may be a volume percentage difference threshold. For instance, the apparatus may determine a volume percentage difference between the first bounding box of the 3D object model and a bounding box of a scan. In some examples, the volume percentage difference may be calculated by determining a volume percentage of the bounding box of the scan relative to a volume of the first bounding box. The apparatus may determine the volume percentage difference by calculating a difference (e.g., subtraction) of the volume percentage of the bounding box of the scan and the percentage (e.g., 100%) of the first bounding box. Determining 204 whether the bounding box size criterion is met may include comparing the volume percentage difference to the volume percentage difference threshold. A bounding box may be selected in a case that the volume percentage difference is within (e.g., is less than or equal to, is at most, is not greater than) the volume percentage difference threshold (e.g., 5%, 10%, 15%, 17%, 20%, etc.). With a volume percentage difference threshold of 15%, for instance, a bounding box may be selected if the bounding box is between 85% and 115% of the volume of the first bounding box. A bounding box of a scan may not be selected (and/or may be discarded) in a case that the volume percentage difference is not within (e.g., is greater than) the volume percentage difference threshold (e.g., 5%, 10%, 15%, 17%, 20%, etc.).

In some examples, the bounding box size criterion may be a size difference threshold. For instance, dimensional size (e.g., length, width, height, area, edge, etc.) difference(s) between a bounding box of a scan and the first bounding box may be utilized and/or a dimensional size difference threshold(s) for a dimension or dimensions may be utilized. For instance, a bounding box of a scan may be selected in a case that a dimensional size difference is within a dimensional size difference threshold (for the X dimension, Y dimension, Z dimension, an edge dimension, and/or a face dimension of the bounding box, etc.). Otherwise, the bounding box may not be selected and/or may be discarded.

In some examples, determining 204 whether the bounding box size criterion may be based on the sizes of minimum bounding boxes of the 3D object model and the scan. The 3D object model and the scan may be comparable if the difference between the bounding box volumes is bounded by a certain threshold (e.g., 10% volume difference). Bounding box volume and/or size verification of the input 3D object model and the scan may enable discarding non-comparable pairs.

In a case that the bounding box size criterion is met, the apparatus may align 206 a first bounding box of the 3D object model with a second bounding box of the 3D scan. In some examples, aligning 206 the first bounding box with the second bounding box may be performed as described in relation to FIG. 1. For example, aligning 206 the first bounding box and the second bounding box may be a deterministic alignment. Deterministic alignment based on bounding boxes (e.g., minimum bounding boxes) may be utilized to detect or discriminate if a 3D object model (e.g., CAD mesh) and a scan are comparable or non-comparable. In cases where the 3D object model and the scan are comparable, deterministic alignment may be utilized to find a significant overlap between the 3D object model and the scan. Aligning 206 the bounding boxes may produce an overlap score. For instance, an alignment with a greatest overlap score (e.g., intersection ratio) may be selected.

The apparatus may determine 208 whether the overlap score of the alignment meets a verification criterion. In some examples, determining 208 whether the overlap score meets the verification criterion may be performed as described in relation to FIG. 1. For example, determining 208 whether the overlap score meets the verification criterion may include comparing the overlap score with an alignment verification threshold. For instance, the overlap score may meet a verification threshold if the overlap score is greater than or equal to the alignment verification threshold (e.g., 95%).

In a case that the verification criterion is met, the apparatus may determine 214 a point-to-point distance between the 3D object model and the scan. In some examples, determining 214 the point-to-point distance may be accomplished as described in relation to FIG. 1. For instance, the apparatus may determine a point-to-point distance (e.g., Euclidean distance) between a point of the 3D object model and a point of the scan for multiple point pairs.

In a case that the verification criterion is not met, the apparatus may perform 210 a random registration. In some examples, performing 210 the random registration may be performed as described in relation to FIG. 1. For example, performing 210 random registration may include downsampling point clouds, extracting a feature histogram (e.g., Fast Point Feature Histogram (FPFH)) descriptor of each point, selecting random points in the point cloud of the scan, and/or detecting corresponding points in the point cloud of the 3D object model by querying nearest neighbors in the feature space (e.g., FPFH feature space). In some approaches, the point cloud of the scan may be transformed iteratively to provide a rough alignment of the down-sampled point clouds. In some examples, the transformation of the down-sampled source point cloud may be utilized as an initialization to compute a more accurate alignment of the point clouds (e.g., dense point clouds). For instance, the apparatus may perform local alignment between the scan and the 3D object model starting from the rough alignment. Local alignment is a procedure for aligning objects or shapes within a local range. For instance, local alignment may provide a local range of alignment or transformation that is smaller than the range of orientations in the deterministic alignment or an initial random registration. In some examples, the apparatus may select a local alignment that most closely matches the scan with the 3D object model. In some examples, performing local alignment may include performing an ICP procedure between the scan and the 3D object. For instance, the ICP procedure may transform the scan to reduce or minimize distance between the scan and the 3D object. In some examples, the ICP procedure may reduce or minimize a sum of squared errors (e.g., differences) of paired coordinate points between the scan and the 3D object.

In some examples, performing the ICP procedure may include performing a two-stage ICP refinement. In a first stage, the apparatus may refine an orientation or orientations by applying a first set of ICP rounds. Each ICP round may include a different coarse voxel proximity threshold (e.g., 1.5, 2, 3, and 4 times a voxel size). For each voxel proximity threshold, the apparatus may create an object that is transformed by a corresponding ICP round. In a second stage, the apparatus may refine the alignments obtained from the first stage by applying a second set of ICP rounds. Each ICP round may have a different fine voxel proximity threshold (e.g., 0.125, 0.25, 0.5 and 0.75 times the voxel size). For instance, the voxel proximity thresholds of the second stage may be less than (e.g., smaller than) the voxel proximity thresholds for the first stage. For each voxel proximity threshold, the apparatus may create an object that is transformed by a corresponding ICP round. The second stage may produce an alignment or alignments. For example, the second stage may produce point clouds or point cloud pairs (e.g., 16 point cloud pairs) with an overlap score for each orientation candidate (e.g., selected orientation candidate), which may indicate an amount of overlap between the 3D object model and the scan (e.g., increased density point cloud, scanned object, etc.).

In some examples, performing 210 the random registration may produce a second overlap score. For example, an overlap score may be evaluated for each alignment (e.g., location, orientation, transformation, etc.) of the random registration. An alignment with the second overlap score (e.g., a greatest overlap score) may be selected.

The apparatus may determine 212 whether the second overlap score meets a verification criterion. The verification criterion for the second overlap score may be the same as the verification criterion for the first overlap score, or may be a different verification criterion (e.g., same or different alignment verification threshold). For example, determining 212 whether the second overlap score meets the verification criterion may include comparing the second overlap score with an alignment verification threshold (that is the same as or different from an alignment verification threshold utilized for the determination 208). For instance, the apparatus may determine whether the second overlap score of the alignment (from the random registration, for instance) meets an alignment verification threshold. In some examples, the second overlap score may meet a verification threshold if the second overlap score is greater than or equal to the alignment verification threshold (e.g., 95%).

In a case that the second overlap threshold meets the alignment verification threshold, the apparatus may determine 214 the point-to-point distance(s) as described above. For instance, the apparatus may determine the point-to-point distance(s) based on the random registration. In a case that the second overlap threshold does not meet the alignment verification threshold, the apparatus may determine that the 3D object model and the scan do not match, and/or may record an indicator that the 3D object model is not a match with the scan. In some examples, the apparatus may discard a pairing of the 3D object model and the scan if the 3D object model and the scan do not match.

The apparatus may determine 216 a deformation metric based on the point-to-point distance(s). In some examples, determining 216 the deformation metric may be accomplished as described above in relation to FIG. 1. For example, the apparatus may determine a mean, median, standard deviation, and/or variance of the deformation (e.g., point-to-point distances) for a 3D object model and/or for a scan.

Figure 5:
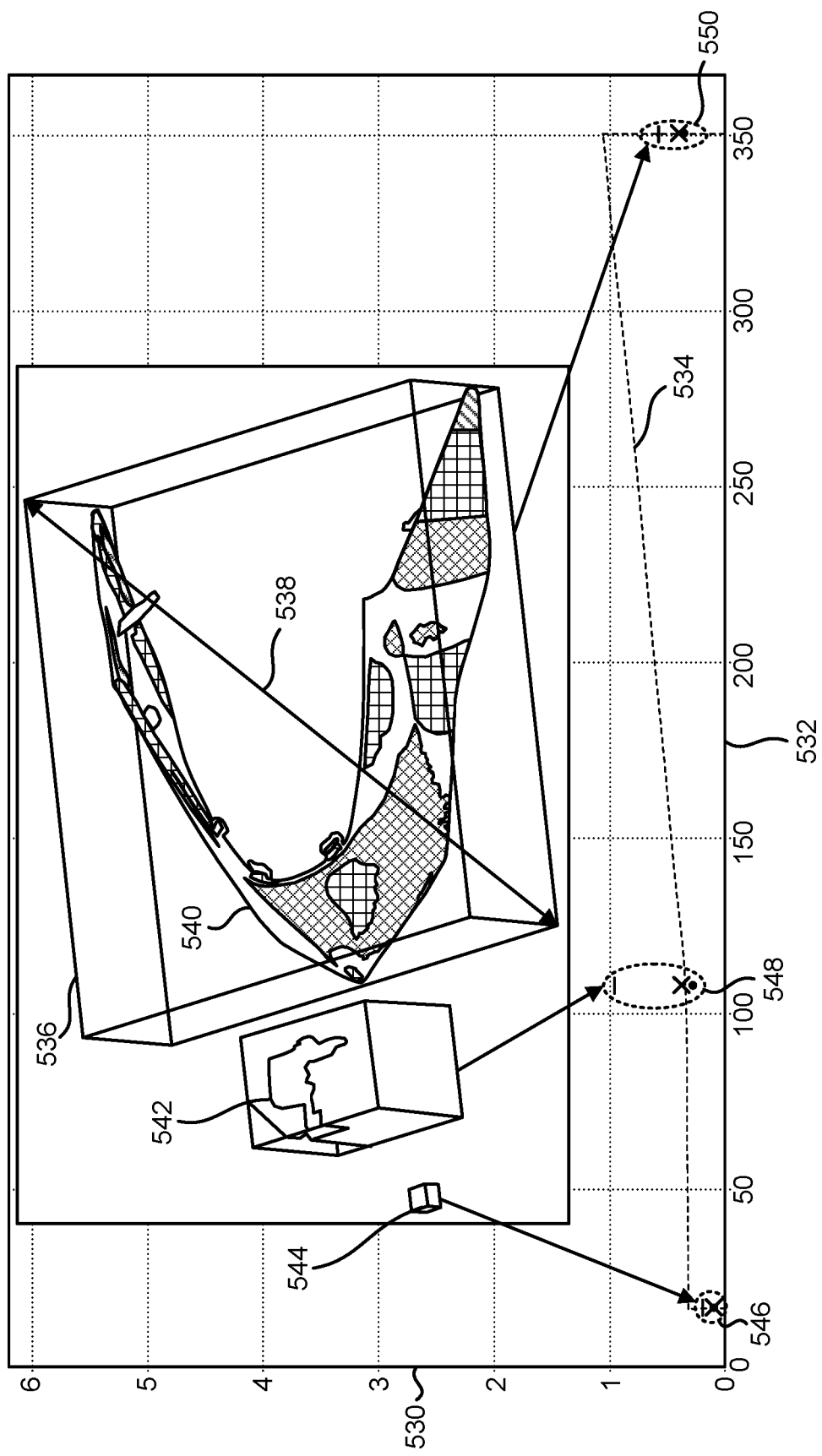
FIG. 5 illustrates an example of a graph in accordance with some of the techniques described herein.

The apparatus may provide 218 the deformation metric(s). For instance, the apparatus may store the deformation metric(s), may send the deformation metric(s) to another device, and/or may present the deformation metric(s) (on a display and/or in a user interface, for example). For example, the apparatus may present the deformation metric(s) on a display. In some examples, the apparatus may plot the deformation metric(s). For instance, the apparatus may plot the deformation metric(s) with a dimensional tolerance. In some examples, a size of an object may be indicated by a diagonal length over a bounding box of the 3D object model and/or over a bounding box of a scan. In some examples, the apparatus may determine a diagonal length of the first bounding box or of the second bounding box. The apparatus may present the deformation metric(s) with the diagonal length. For example, the apparatus may generate a graph, where a first axis (e.g., an x axis) represents object size (e.g., bounding box diagonal length) and a second axis (e.g., y axis) represents a degree of deformation (e.g., deformation in millimeters (mm)). The apparatus may plot the deformation metric on the graph. In some examples, the apparatus may plot the deformation metric with a dimensional tolerance on the graph. For example, the apparatus may plot and/or present the deformation metric (e.g., mean, median, standard deviation, mean+standard deviation, and/or variance, etc.) on the graph with a dimensional tolerance. The dimensional tolerance may vary as a function of object size (e.g., may vary over the first axis). An example of a graph in accordance with some of the techniques described here is illustrated in FIG. 5.

In some examples, the apparatus may train a machine learning model based on the alignment and/or assessed deformation (e.g., point-to-point distance(s)) and/or the deformation metric(s). For instance, the apparatus may utilize the alignment and/or assessed deformation as a ground truth to train the machine learning model. The machine learning model may be utilized to predict deformation and/or compensation for object manufacturing.

Some of the techniques described herein may be implemented to evaluate 3D object deformation of manufactured objects (e.g., geometry). For example, some of the techniques described herein may enable finding comparable pairs of 3D object models and scans from a pool or pools of 3D object models and scans. In some examples, shape deformation may be determined at a point cloud level by determining a point-to-point mapping between a 3D object model and a scan, which may be utilized to compute the distance deformation per point. Deformation metrics may be determined with a corresponding tolerance at an object level and/or a pool level. A pool or pools may include two sets of point clouds and/or meshes: a set of 3D object models and a set of scans. A pair or pairs of the 3D object models and scans may be assessed for comparability and/or deformation. In some examples, the deformation assessment may be automatic.

Some examples of the techniques described herein may utilize two approaches (e.g., deterministic alignment and random registration) to align or register scans with 3D object models. Benefits from both approaches may be realized. Some of the techniques described herein may beneficially utilize bounding boxes (e.g., minimum bounding boxes) to find orientations for deterministic registration. Deformation may be assessed based on the deterministic registration. In some examples, operation(s), function(s), and/or element(s) of the method 200 may be omitted and/or combined.

Figure 3:
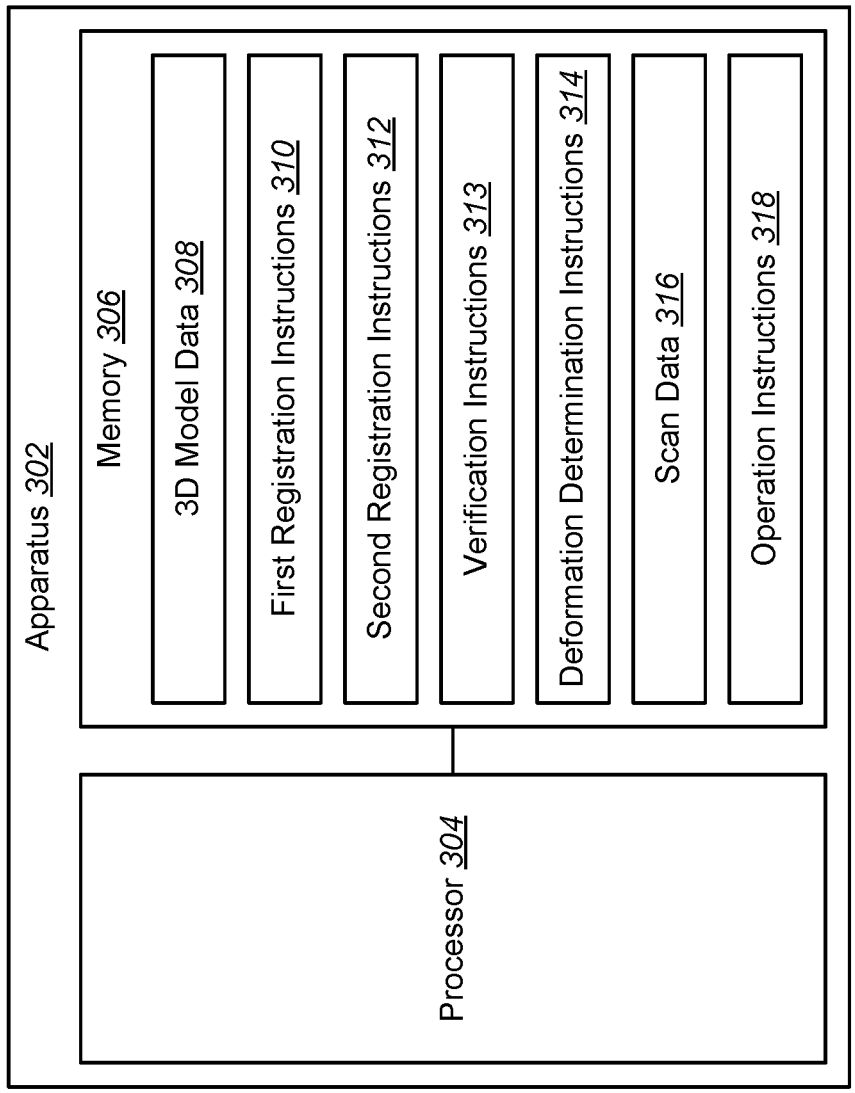
FIG. 3 is a block diagram of an example of an apparatus that may be used in object deformation determination.

FIG. 3 is a block diagram of an example of an apparatus 302 that may be used in object deformation determination. The apparatus 302 may be a computing device, such as a personal computer, a server computer, a printer, a 3D printer, a smartphone, a tablet computer, etc. The apparatus 302 may include and/or may be coupled to a processor 304, and/or a memory 306. In some examples, the apparatus 302 may be in communication with (e.g., in electronic communication with, coupled to, have a communication link with, etc.) a manufacturing device (e.g., a 3D printing device). In some examples, the apparatus 302 may be an example of a 3D printing device. The apparatus 302 may include additional components (not shown) and/or some of the components described herein may be removed and/or modified without departing from the scope of this disclosure.

The processor 304 may be any of a central processing unit (CPU), a semiconductor-based microprocessor, graphics processing unit (GPU), field-programmable gate array (FPGA), an application-specific integrated circuit (ASIC), and/or other hardware device suitable for retrieval and execution of instructions stored in the memory 306. The processor 304 may fetch, decode, and/or execute instructions (e.g., first registration instructions 310, second registration instructions 312, and/or deformation determination instructions 314) stored in the memory 306. In some examples, the processor 304 may include an electronic circuit or circuits that include electronic components for performing a functionality or functionalities of the instructions (e.g., first registration instructions 310, second registration instructions 312, and/or deformation determination instructions 314). In some examples, the processor 304 may perform one, some, or all of the functions, operations, elements, methods, etc., described in connection with one, some, or all of FIGS. 1-5.

The memory 306 may be any electronic, magnetic, optical, or other physical storage device that contains or stores electronic information (e.g., data, instructions, and/or executable code). Thus, the memory 306 may be, for example, Random Access Memory (RAM), Electrically Erasable Programmable Read-Only Memory (EEPROM), a storage device, an optical disc, and the like. In some implementations, the memory 306 may be a non-transitory tangible machine-readable storage medium, where the term "non-transitory" does not encompass transitory propagating signals.

In some examples, the apparatus 302 may also include a data store (not shown) on which the processor 304 may store information. The data store may be volatile and/or non-volatile memory, such as Dynamic Random Access Memory (DRAM), EEPROM, magnetoresistive random-access memory (MRAM), phase change RAM (PCRAM), memristor, flash memory, and the like. In some examples, the memory 306 may be included in the data store. In some examples, the memory 306 may be separate from the data store. In some approaches, the data store may store similar instructions and/or data as that stored by the memory 306. For example, the data store may be non-volatile memory and the memory 306 may be volatile memory.

In some examples, the apparatus 302 may include an input/output interface (not shown) through which the processor 304 may communicate with an external device or devices (not shown), for instance, to receive and store the information pertaining to objects for which deformations are to be determined. The input/output interface may include hardware and/or machine-readable instructions to enable the processor 304 to communicate with the external device or devices. The input/output interface may enable a wired or wireless connection to the external device or devices. In some examples, the input/output interface may further include a network interface card and/or may also include hardware and/or machine-readable instructions to enable the processor 304 to communicate with various input and/or output devices, such as a keyboard, a mouse, a display, another apparatus, electronic device, computing device, etc., through which a user may input instructions into the apparatus 302. In some examples, the apparatus 302 may receive 3D model data 308 and/or scan data 316 from an external device or devices (e.g., scanner, removable storage, network device, etc.).

In some examples, the memory 306 may store 3D model data 308. The 3D model data 308 may be generated by the apparatus 302 and/or received from another device. Some examples of 3D model data 308 include a 3D manufacturing format (3MF) file or files, a 3D computer-aided drafting (CAD) image, object shape data, mesh data, geometry data, point cloud data, etc. The 3D model data 308 may indicate the shape an object or objects.

In some examples, the memory 306 may store scan data 316. The scan data 316 may be generated by the apparatus 302 and/or received from another device. Some examples of scan data 316 include object shape data, mesh data, geometry data, point cloud data, depth map data, etc. The scan data 316 may indicate the shape of an object or objects that have been manufactured (e.g., printed).

The memory 306 may store first registration instructions 310. The processor 304 may execute the first registration instructions 310 to register objects. For instance, the processor 304 may execute the first registration instructions 310 to register a 3D object model with a scan of an object. The 3D object model may be stored as and/or represented by the 3D model data 308, for instance. The scan may be stored as and/or represented by the scan data 316, for instance. In some examples, the processor 304 may execute the first registration instructions 310 to perform a first registration of a 3D object model with a scan based on a first bounding box of the 3D object model and a second bounding box of the scan. Performing the first registration may be accomplished as described in relation to FIG. 1 and/or FIG. 2 in some examples. In some examples, the first registration is a deterministic registration.

The memory 306 may store verification instructions 313. The processor 304 may execute the verification instructions 313 to verify a registration. For instance, the processor 304 may execute the verification instructions 313 to verify whether a registration (e.g., first registration, deterministic registration, second registration, random registration, etc.) satisfies a verification criterion. A satisfied verification criterion may indicate a match between the 3D object model and the scan. In some examples, the registration may indicate a match between the 3D object model and the scan if an overlap score meets a verification criterion or criteria. For example, the processor 304 may execute the verification instructions 313 to determine if an overlap score meets an alignment verification threshold or thresholds. The overlap score may be determined from a first registration (e.g., a deterministic registration) or a second registration (e.g., a random registration), for instance. Verifying the registration may be accomplished as described in relation to FIG. 1 and/or FIG. 2 in some examples.

The memory 306 may store second registration instructions 312. The processor 304 may execute the second registration instructions 312 to register objects. For instance, the processor 304 may execute the second registration instructions 312 to register a 3D object model with a scan of an object. In some examples, the processor 304 may execute the second registration instructions 312 to perform a second registration of a 3D object model with a scan in response to determining that the first registration does not satisfy a verification criterion. Performing the second registration may be accomplished as described in relation to FIG. 1 and/or FIG. 2 in some examples. In some examples, the second registration is a random registration.

The memory 306 may store deformation determination instructions 314. The processor 304 may execute the deformation determination instructions 314 to register objects. For instance, the processor 304 may execute the deformation determination instructions 314 to determine a deformation of the scan relative to the 3D object model. In some examples, the processor 304 may execute the deformation determination instructions 314 to determine the deformation of the scan relative to the 3D object model in response to determining that the first registration or the second registration satisfies a verification criterion. Determining the deformation may be accomplished as described in relation to FIG. 1 and/or FIG. 2 in some examples.

In some examples, the processor 304 may execute the operation instructions 318 to perform an operation based on the determined deformation. For example, the processor 304 may present the determined deformation, may store the determined deformation in the memory 306, and/or may send the determined deformation to another device or devices. In some examples, the processor 304 may present the deformation on a display and/or user interface. For example, the processor 304 may present a point cloud and/or mesh that indicates a degree of deformation over the 3D object model and/or the scan. For instance, regions with greater deformation may be color coded differently from regions with less or no deformation. In some examples, the processor 304 may present a graph that indicates the determined deformation (e.g., deformation metric(s)) relative to a size of an object and/or a deformation tolerance. In some examples, the apparatus may determine a diagonal length of the first bounding box or of the second bounding box. The apparatus may present the deformation metric(s) with the diagonal length. In some examples, the processor 304 may manufacture (e.g., print) an object or objects based on the determined deformation. For instance, the processor 304 may determine a compensation to reduce or avoid the determined deformation. The processor 304 may drive model setting based on a deformation-compensated 3D model that is based on the determined deformation.

Figure 4:
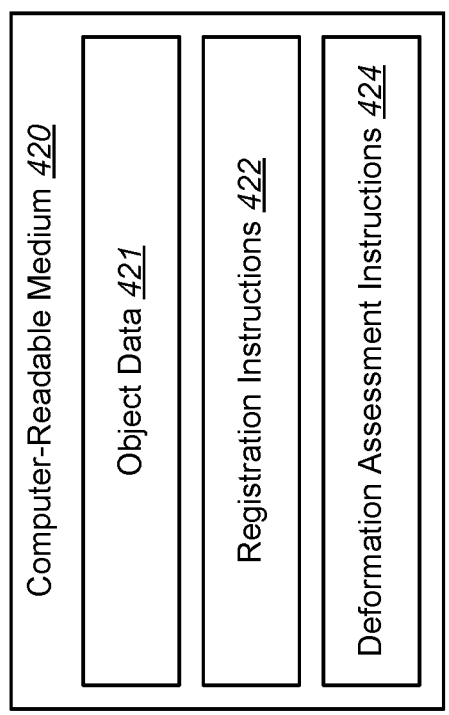
FIG. 4 is a block diagram illustrating an example of a computer-readable medium for registering objects.

FIG. 4 is a block diagram illustrating an example of a computer-readable medium 420 for registering objects. The computer-readable medium 420 may be a non-transitory, tangible computer-readable medium 420. The computer-readable medium 420 may be, for example, RAM, EEPROM, a storage device, an optical disc, and the like. In some examples, the computer-readable medium 420 may be volatile and/or non-volatile memory, such as DRAM, EEPROM, MRAM, PCRAM, memristor, flash memory, and the like. In some implementations, the memory 306 described in connection with FIG. 3 may be an example of the computer-readable medium 420 described in connection with FIG. 4.

The computer-readable medium 420 may include code (e.g., data and/or instructions). For example, the computer-readable medium 420 may include object data 421, registration instructions 422, and/or deformation assessment instructions 424.

In some examples, the computer-readable medium 420 may store object data 421. Some examples of object data 421 include a 3MF file or files, a 3D CAD file, object shape data, point cloud data, scan data, mesh data, geometry data, etc. The object data 421 may indicate the shape of a 3D object model and/or scans of 3D objects.

In some examples, the registration instructions 422 are code to cause a processor to align a 3D object model with a scan based on bounding boxes. In some examples, this may be accomplished as described in connection with FIG. 1, FIG. 2, and/or FIG. 3. For example, the registration instructions 422 may cause a processor to perform a deterministic registration and/or a random registration. In some examples, the random registration may be performed in response to determining that a verification criterion is not satisfied for the deterministic registration.

In some examples, the deformation assessment instructions 424 are code to cause the processor to determine a point-to-point distance matrix for point pairs from the 3D object model and the scan based on the alignment. In some examples, this may be accomplished as described in relation to FIG. 1, FIG. 2, and/or FIG. 3. For instance, when a 3D object model (e.g., CAD model) and a scan are properly aligned, the deformation assessment instructions 424 may be executed to sample a point cloud over the surface of the 3D object model and the and sample a point cloud over the scan and compute a point-to-point distance matrix. In some examples, determining the point-to-point matrix may include finding, for each point in the point cloud of the 3D object model, a nearest point on the scan point cloud. The deformation assessment instructions 424 may be executed to determine Euclidian distance between the points. In some examples, the point-to-point matrix may include the pair of nearest points from the 3D object model and the scan point clouds together with the distances between pairs. In some examples, the point-to-point distance matrix indicates an association between a first point from the 3D object model, a second point from the scan that is nearest to the first point, and a distance between the first point and the second point. For instance, the point-to-point matrix may indicate the association for each point pair.

In some examples, the deformation assessment instructions 424 may include code to cause the processor to determine a statistical deformation metric based on the point-to-point distance matrix. For example, the deformation assessment instructions 424 may include code to cause a processor to perform a statistical analysis of the point-to-point distance matrix. For instance, the processor may compute a median, mean, standard deviation, and/or variance of the deformation (e.g., point-to-point distances) in the point-to-point distance matrix. In some examples, the point-to-point distance matrix may be utilized to compute minimum, maximum, mean, median, and/or or standard deviation from point pair distances. In some examples, statistical deformation metric(s) may be determined from the set of (e.g., all) aligned point pairs from the 3D object model and the scan. For instance, a maximum length diagonal of each bounding box may be utilized to represent the size of each object. In some examples, the size of each object may be plotted as a value relative to an axis (e.g., horizontal axis, x axis, etc.), while statistical deformation metric(s) (e.g., minimum, maximum, mean, median deformation, etc.) may be plotted relative to another axis (e.g., vertical axis, y axis, etc.).

FIG. 5 illustrates an example of a graph in accordance with some of the techniques described herein. In this example, the graph is illustrated in deformation 530 (in millimeters) over object size 532 (in millimeters). FIG. 5 also illustrates examples of a first object 544, a second object 542, and a third object 540 overlaid on the graph (with separate scales and views). In some examples, a depiction of an object or objects may or may not be presented with a graph. An object size 538 (diagonal length over a bounding box 536) of the third object 540 is also illustrated. As shown in FIG. 5, the first object 544 has a smallest object size. First deformation metrics 546 corresponding to the first object 544, including median (where medians are illustrated as dots), mean (where means are illustrated as crosses), and mean+standard deviation (where means+standard deviations are illustrated as lines) with a dimensional tolerance 534 are shown. Second deformation metrics 548 corresponding to the second object 542 are also shown. Third deformation metrics 550 corresponding to the third object 540 are also shown. As illustrated with respect to the third object 540, a degree of deformation may be depicted. In FIG. 5, a low degree of deformation is illustrated with diagonal cross hatching, a medium degree of deformation is illustrated with vertical cross hatching, and a high degree of deformation is illustrated with diagonal hatching. Different approaches may be utilized to illustrate degrees of deformation (e.g., color coding, shading, patterning, etc.).

Some examples of the techniques described herein provide approaches that utilize bounding boxes (e.g., minimum bounding boxes) for object registration and/or deformation assessment. In 3D printing, many (e.g., hundreds of) objects may be packed into a build volume. The build volume may have a corresponding file (e.g., 3MF file) that indicates the position and orientation of each object in the build volume. When the build volume is printed, the objects in the build volume may be printed together. After printing, each object may be removed from the build volume for cleaning and/or post-processing. These procedures may result in untraceable transformations (e.g., translation and/or rotation) of objects relative to the original object positions and/or orientations in the build volume.

A printed object or objects may be scanned to produce a point cloud (e.g., scanned 3D file) that represents the shape of the printed object(s). To evaluate the geometrical accuracy of the print, the point cloud may be compared with the original CAD file to generate a deformation assessment. The 3D information (e.g., the CAD file and point clouds) may be aligned to recover the transformation that the printed object or objects have undergone. Aligning the object and the scan may be challenging because the search space of the transformation may be very large.

While various examples of systems and methods are described herein, the systems and methods are not limited to the examples. Variations of the examples described herein may be implemented within the scope of the disclosure. For example, operations, functions, aspects, or elements of the examples described herein may be omitted or combined.

The invention claimed is:

1. A method comprising:
aligning a first minimum bounding box of a three-dimensional (3D) object model with a second minimum bounding box of a scan;
determining a deformation between the 3D object model and the scan based on whether a first overlap score of the alignment meets an alignment verification threshold that is at least 75% by comparing the first overlap score with the alignment verification threshold;
when the alignment verification threshold is not met by the first overlap score, performing a random registration to produce a second overlap score; and
determining whether the second overlap score meets the alignment verification threshold by comparing the second overlap score with the alignment verification threshold.

2. The method of claim 1, further comprising determining a point-to-point distance between the 3D object model and the scan in a case that the alignment verification threshold is met.

3. The method of claim 2, wherein determining the deformation comprises determining a deformation metric based on the point-to-point distance, wherein the deformation metric is a mean, a median, or a standard deviation.

4. The method of claim 3, further comprising plotting the deformation metric with a dimensional tolerance, wherein the dimensional tolerance is a tolerated deformation amount that is relative to a size of the object.

5. An apparatus comprising:

a memory;

a processor in electronic communication with the memory, wherein the processor is to:

perform a first registration of a three-dimensional (3D) object model with a scan based on a first minimum bounding box of the 3D object model and a second minimum bounding box of the scan to determine whether the first registration satisfies an alignment verification threshold that is at least 75%;

perform a second registration of the 3D object model with the scan in response to determining that the first registration does not satisfy the alignment verification threshold, wherein the second registration is randomized; and determine a deformation of the scan relative to the 3D object model in response to determining that the second registration satisfies the alignment verification threshold.

6. The apparatus of claim 5, wherein the first registration is a deterministic registration.

7. The apparatus of claim 6, wherein the processor is to:

determine a diagonal length of the first minimum bounding box or the second minimum bounding box; and present a deformation metric with the diagonal length.

* * * * *